United States Patent
Sun et al.

(10) Patent No.: US 6,630,384 B1
(45) Date of Patent: Oct. 7, 2003

(54) METHOD OF FABRICATING DOUBLE DENSED CORE GATES IN SONOS FLASH MEMORY

(75) Inventors: Yu Sun, Saratoga, CA (US); Michael A. Van Buskirk, Saratoga, CA (US); Mark T. Ramsbey, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/971,483

(22) Filed: Oct. 5, 2001

(51) Int. Cl.$^7$ .............................................. H01L 21/336
(52) U.S. Cl. ...................................... 438/266; 438/267
(58) Field of Search ................................ 438/257, 258, 438/259, 260, 261, 262, 263, 264, 265, 266, 267, 197, 198, 199, 200, 279; 257/314–316, 21.679, 21.68, 21.681, 21.687, 21.688

(56) References Cited

U.S. PATENT DOCUMENTS

| | | | |
|---|---|---|---|
| 4,173,766 A | 11/1979 | Hayes | 357/23 |
| 5,168,334 A | 12/1992 | Mitchell et al. | 257/324 |
| 5,349,221 A | 9/1994 | Shimoji | 257/324 |
| 5,467,038 A * | 11/1995 | Motley et al. | 365/185.01 |
| 5,644,533 A | 7/1997 | Lancaster et al. | 365/185.18 |
| 5,768,192 A | 6/1998 | Eitan | 365/185.24 |
| 5,825,686 A | 10/1998 | Schmitt-Landsiedel et al. | 365/185.03 |
| 5,963,465 A | 10/1999 | Eitan | 365/63 |
| 5,963,480 A * | 10/1999 | Harari | 365/185.29 |
| 5,996,603 A | 12/1999 | Eitan | 438/258 |
| 6,001,709 A | 12/1999 | Chuang et al. | 438/440 |
| 6,011,725 A | 1/2000 | Eitan | 365/185.33 |
| 6,030,871 A | 2/2000 | Eitan | 438/276 |
| 6,201,277 B1 * | 3/2001 | Esquivel | 257/316 |

FOREIGN PATENT DOCUMENTS

WO  9960631  5/1999  ......... H01L/29/792

OTHER PUBLICATIONS

T.Y. Chan, et al.; "A True Single–Transistor Oxide–Nitride–Oxide EEPROM Device"; IEEE Elecron Device Letters, vol. EDL 8, No. 3, Mar. 1987; pp. 93–95.

Daniel C. Guterman, et al.; "An Electrically Alterable Nonvolatile Memory Cell Using a Floating–Gate Structure"; IEEE Transactions on Electron Devices, vol. ED–26, No. 4, Apr. 1979; pp. 576–586.

Boaz Eitan, et al.; "NROM: A Novel Localized Trapping, 2–Bit Nonvolatile Memory Cell"; IEEE Electron Device Letters, vol. 21, No. 11 Nov. 2000; pp. 543–545.

* cited by examiner

Primary Examiner—William David Coleman
Assistant Examiner—Brook Kebede
(74) Attorney, Agent, or Firm—Amin & Turocy, LLP

(57) ABSTRACT

One aspect of the present invention relates to a method of forming a non-volatile semiconductor memory device, involving forming a charge trapping dielectric over a substrate, the substrate having a core region and a periphery region; forming a first set of memory cell gates over the charge trapping dielectric in the core region; forming a conformal insulation material layer around the first set of memory cell gates; and forming a second set of memory cell gates in the core region, wherein each memory cell gate of the second set of memory cell gates is adjacent to at least one memory cell gate of the first set of memory cell gates, each memory cell gate of the first set of memory cell gates is adjacent at least one memory cell gate of the second set of memory cell gates, and the conformal insulation material layer is positioned between each adjacent memory cell gate.

22 Claims, 5 Drawing Sheets

METHOD OF FABRICATING DOUBLE DENSED CORE GATES IN SONOS FLASH MEMORY

TECHNICAL FIELD

The present invention generally relates to fabricating nonvolatile semiconductor memory devices. In particular, the present invention relates to improved methods of fabricating SONOS type nonvolatile memory devices.

BACKGROUND ART

Conventional floating gate flash memory types of EEPROMs (electrically erasable programmable read only memory), employ a memory cell characterized by a vertical stack of a tunnel oxide, a first polysilicon layer over the tunnel oxide, an ONO (oxide-nitride-oxide) interlevel dielectric over the first polysilicon layer, and a second polysilicon layer over the ONO interlevel dielectric. For example, Guterman et al (IEEE Transactions on Electron Devices, Vol. 26, No. 4, p. 576, 1979) relates to a floating gate nonvolatile memory cell consisting of a floating gate sandwiched between a gate oxide and an interlevel oxide, with a control gate over the interlevel oxide.

Generally speaking, a flash memory cell is programmed by inducing hot electron injection from a portion of the substrate, such as the channel section near the drain region, to the floating gate. Electron injection carries negative charge into the floating gate. The injection mechanism can be induced by grounding the source region and a bulk portion of the substrate and applying a relatively high positive voltage to the control electrode to create an electron attracting field and applying a positive voltage of moderate magnitude to the drain region in order to generate "hot" (high energy) electrons. After sufficient negative charge accumulates on the floating gate, the negative potential of the floating gate raises the threshold voltage of its field effect transistor (FET) and inhibits current flow through the channel region through a subsequent "read" mode. The magnitude of the read current is used to determine whether or not a flash memory cell is programmed. The act of discharging the floating gate of a flash memory cell is called the erase function. The erase function is typically carried out by a Fowler-Nordheim tunneling mechanism between the floating gate and the source region of the transistor (source erase or negative gate erase) or between the floating gate and the substrate (channel erase). A source erase operation is induced by applying a high positive voltage to the source region and grounding the control gate and the substrate while floating the drain of the respective memory cell.

Subsequently, SONOS (Silicon Oxide Nitride Oxide Silicon) type memory devices have been introduced. See Chan et al, IEEE Electron Device Letters, Vol. 8, No. 3, p. 93, 1987. SONOS type flash memory cells are constructed having a charge trapping non-conducting dielectric layer, typically a silicon nitride layer, sandwiched between two silicon dioxide layers (insulating layers). The nonconducting dielectric layer functions as an electrical charge trapping medium. A conducting gate layer is placed over the upper silicon dioxide layer. Since the electrical charge is trapped locally near whichever side that is used as the drain, this structure can be described as a two-transistor cell, or two-bits per cell. If multi-level is used, then four or more bits per cell can be accomplished. Multi-bit cells enable SONOS type memory devices to have the advantage over others in facilitating the continuing trend increasing the amount of information held/processed on an integrated circuit chip.

SONOS type memory devices offer various advantages. In particular, the erase mechanism of the memory cell is greatly enhanced. Both bits of the memory cell can be erased by applying suitable erase voltages to the gate and the drain for the right bit and to the gate and the source for the left bit. Another advantage includes reduced wearout from cycling thus increasing device longevity. An effect of reading in the reverse direction is that a much higher threshold voltage for the same amount of programming is possible. Thus, to achieve a sufficient delta in the threshold voltage between the programmed and unprogrammed states of the memory cell, a much smaller region of trapped charge is required when the cell is read in the reverse direction than when the cell is read in the forward direction.

The erase mechanism is enhanced when the charge trapping region is made as narrow as possible. Programming in the forward direction and reading in the reverse direction permits limiting the width of the charge trapping region to a narrow region near the drain (right bit) or the source. This allows for much more efficient erasing of the memory cell.

Another advantage of localized charge trapping is that during erase, the region of the nitride away from the drain does not experience deep depletion since the erase occurs near the drain only. The final threshold of the cell after erasing is self limited by the device structure itself. This is in direct contrast to conventional single transistor floating gate flash memory cells which often have deep depletion problems.

Although many advantages are described above, there are at least two disadvantages associated with SONOS type memory devices. One disadvantage is that isolation by LOCOS (LOCal Oxidation of Silicon) takes up a relatively large amount of space. Given the continuing trend towards miniaturization and increased integration of devices on an integrated circuit chip, efficient utilization of space is of increasing importance. Isolation by LOCOS also causes undesirable outgassing of dopants.

Another disadvantage with SONOS type memory devices is that LOCOS formation causes short channeling. There are high temperatures associated with LOCOS formation, often from 800° C. to 1,100° C. Short channeling is a decrease in the effective channel length, often represented as $L_{eff}$. Unnecessarily decreasing the effective channel length results in an undesirably large current passing through the transistor at low gate voltages such as when the transistor is in the "off" state.

Thermal cycling associated with LOCOS formation also causes an increase in bitline to bitline punch-through leakage. That is, diffusion caused by thermal cycling leads to undesirable leakage between bitlines.

Generally speaking, in the semiconductor industry, there is a continuing trend toward higher device densities. To achieve these high densities there has been and continues to be efforts toward scaling down the device dimensions on semiconductor wafers. In order to accomplish such high device packing density, smaller and smaller features sizes are required. This includes the width and spacing of such features. This trend impacts the design and fabrication of non-volatile semiconductor memory devices, including SONOS type memory devices.

Referring to FIG. 1, a portion of the core region of a prior art SONOS type memory devices according to Mitchell et al U.S. Pat. No. 5,168,334 is shown. FIG. 1 is analogous to FIG. 5 of Mitchell et al U.S. Pat. No. 5,168,334. FIG. 1 shows silicon substrate 25 having field oxide regions 38 and 40, bitlines 44 and 46, ONO trilayer 50/52/54, and polysilicon wordlines 56 and 66. As shown, the structure has unutilized space between wordlines 56 and 66. There is an unmet need in the art to further scale semiconductor memory devices including SONOS type memory devices.

SUMMARY OF THE INVENTION

The present invention provides a process for fabricating SONOS type nonvolatile memory devices having increased density. In particular, the present invention provides SONOS type nonvolatile memory devices having an increased density of gates/wordlines in the core region. The number of memory cells within the array can be substantially increased. The "double densed" SONOS type nonvolatile memory devices typically have a substantially planar structure. The present invention eliminates high temperature thermal cycling associated with LOCOS formation in the core region, thereby minimizing and/or eliminating short channeling. The present invention also eliminates undesirable bird's beak associated with LOCOS formation which may lead to fewer defects and/or improved scaling.

One aspect of the present invention relates to a method of forming a nonvolatile semiconductor memory device, involving forming a charge trapping dielectric over a substrate, the substrate having a core region and a periphery region; forming a first set of memory cell gates over the charge trapping dielectric in the core region; forming a conformal insulation material layer around the first set of memory cell gates; and forming a second set of memory cell gates in the core region, wherein each memory cell gate of the second set of memory cell gates is adjacent to at least one memory cell gate of the first set of memory cell gates, each memory cell gate of the first set of memory cell gates is adjacent at least one memory cell gate of the second set of memory cell gates, and the conformal insulation material layer is positioned between each adjacent memory cell gate.

Another aspect of the present invention relates to a method of increasing core gate density in a non-volatile semiconductor memory device, involving forming a charge trapping dielectric over a substrate, the substrate having a core region and a periphery region; forming a first set of memory cell gates over the charge trapping dielectric in the core region; growing a silicon dioxide layer around the first set of memory cell gates; depositing an insulation material layer conformally over the silicon dioxide layer; depositing a polysilicon layer over the insulation material layer; and planarizing the substrate to form a second set of memory cell gates in the core region, wherein each memory cell gate/wordline of the second set of memory cell gates is adjacent at least one memory cell gate gate/wordline of the first set of memory cell gates, and the silicon dioxide layer and the insulation material layer are positioned between each adjacent memory cell gate.

DISCLOSURE OF INVENTION

The present invention involves a process for fabricating SONOS type nonvolatile memory devices, and in particular, SONOS type nonvolatile memory devices having improved scaling of gates/wordlines in the core region. An increased number of SONOS type memory cells may be formed in an array thereby improving the memory capacity of the SONOS type memory devices. In one embodiment, the number of SONOS type memory cells in a given array can be increased by up to about 100% (doubled) compared to conventional processing. In another embodiment, the number of SONOS type memory cells in a given array can be increased at least about 50% compared to conventional processing.

One aspect of the present invention involves providing non-volatile semiconductor memory devices that have "double densed" gates in the core region. As a result, significant improvements in scaling can be achieved. Another aspect of the present invention involves a process for fabricating non-volatile semiconductor memory devices that do not contain LOCOS in the core region. As a result, undesirable bird's beak and high temperature thermal cycling associated with LOCOS formation is minimized and/or eliminated. The present invention may also provide memory devices having substantially planar structures.

The present invention is now described with reference to the figures, wherein like features are referred to with like numbers throughout. Since the present invention involves increasing the density of gates/wordlines in the core region, only the core region is shown in the figures (processing in the periphery region is not shown). Standard processing can be conducted in the periphery region. The core region contains the memory cells and the periphery region contains the rest of the chip such as the controlling logic and input/output devices.

Figure 2:
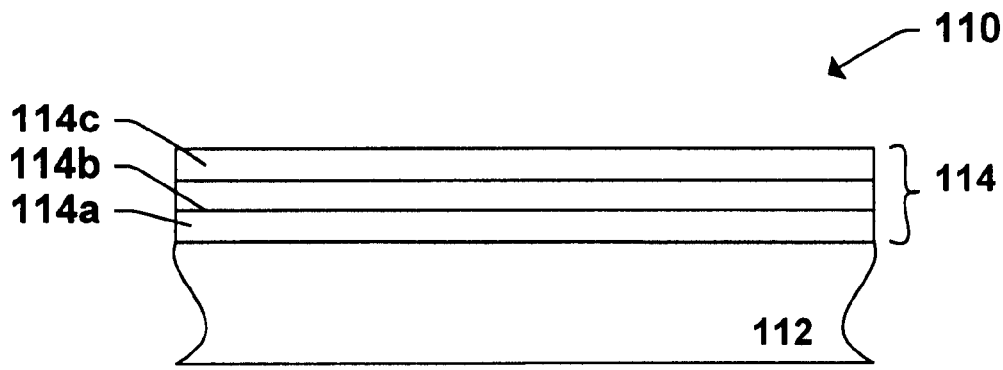
FIG. 2 illustrates a cross-sectional view of a portion of the core region while making a SONOS type memory device in one aspect of the present invention.

One aspect of the present invention is described in FIGS. 2–6. Referring to FIG. 2, a semiconductor structure 110 is shown with a semiconductor substrate 112 under a charge trapping dielectric 114. As shown the charge trapping dielectric 114 contains three layers; namely, a first silicon dioxide layer 114a, a silicon nitride layer 114b, and a second silicon dioxide layer 114c (an ONO dielectric). Particularly in the case of an ONO dielectric, the electron trapping occurs in the silicon nitride layer 114b.

The charge trapping dielectric 114, may be any dielectric layer or layers that are capable of or facilitate electron trapping. In other words, to facilitate electron trapping, the charge trapping dielectric has a layer with a lower barrier height than the layers sandwiching it (two layers with relatively higher barrier heights sandwiching a layer with a relatively lower barrier height). In the case of an ONO trilayer dielectric, the oxide layers have a barrier height of about 3.1 eV whereas the nitride layer has a barrier height of about 2.1 eV. In this connection, a well is created in the middle layer.

For example, charge trapping dielectrics include an ONO trilayer dielectric, an oxide/nitride bilayer dielectric, a nitride/oxide bilayer dielectric, an oxide/tantalum oxide bilayer dielectric ($SiO_2/Ta_2O_5$), an oxide/tantalum oxide/ oxide trilayer dielectric ($SiO_2/Ta_2O_5/SiO_2$), an oxide/ strontium titanate bilayer dielectric ($SiO_2/SrTiO_3$), an oxide/ barium strontium titanate bilayer dielectric ($SiO_2/$ $BaSrTiO_2$), an oxide/strontium titanate/oxide trilayer dielectric ($SiO_2/SrTiO_3/SiO_2$), an oxide/strontium titanate/ barium strontium titanate trilayer dielectric ($SiO_2/SrTiO_3/$ $BaSrTiO_2$), an oxide/hafnium oxide/oxide trilayer dielectric, and the like (in each case, the first layer mentioned is the bottom layer while the last layer mentioned is the top layer). Although the term SONOS type nonvolatile memory device is often used herein, it is to be understood that a SONOS type nonvolatile memory device as used herein may contain any of the charge trapping dielectrics described above. In other words, a SONOS type nonvolatile memory device contains any dielectric layer or layers that are capable of or facilitate electron trapping, and the SONOS type nonvolatile memory device contains an ONO charge trapping dielectric only when a specific reference to such dielectric is indicated.

Moreover, in the embodiments where the charge trapping dielectric is an ONO dielectric, one or both of the silicon dioxide layers 114a and 114c may be a silicon-rich silicon dioxide layer. One or both of the silicon dioxide layers 114a and 114c may also be an oxygen-rich silicon dioxide layer. One or both of the silicon dioxide layers 114a and 114c may be a thermally grown or a deposited oxide. One or both of the silicon dioxide layers 114a and 114c may be nitrided oxide layers. The nitride 114b may be a silicon-rich silicon nitride layer. The nitride 114b may also be an nitrogen-rich silicon nitride layer. In one embodiment, the charge trapping dielectric 114 has a thickness from about 75 Å to about 300 Å. In another embodiment, the charge trapping dielectric 114 has a thickness from about 100 Å to about 275 Å. In yet another embodiment, the charge trapping dielectric 114 has a thickness from about 110 Å to about 250 Å.

In this connection, in one embodiment, the oxide layers 114a and 114c individually have thicknesses from about 50 Å to about 150 Å while the nitride layer 114b has a thickness from about 20 Å to about 80 Å. In another embodiment, the oxide layers 114a and 114c individually have thicknesses from about 60 Å to about 140 Å while the nitride layer 114b has a thickness from about 25 Å to about 75 Å. In yet another embodiment, the oxide layers 114a and 114c individually have thicknesses from about 70 Å to about 130 Å while the nitride layer 114b, has a thickness from about 30 Å to about 70 Å.

Although not shown, a threshold implant ($V_T$ adjustment implant) step may be conducted before formation of the charge trapping dielectric 114 over the structure. For example, a blanket implantation of boron may be performed just prior to forming the charge trapping dielectric 114. As explained below, this threshold implantation step may be conducted before or after the bitline implantation step.

Again, although not completely shown, a mask such as a suitable photoresist is used to partially cover the charge trapping dielectric 114 in the core region 113 while covering the periphery region of the structure 110. In the core region 113, the mask is patterned such that there are openings to facilitate/correspond to the formation of the buried bitlines 117 (that is, areas of the charge trapping dielectric 114 directly over the subsequently formed buried bitlines 117 are exposed by the openings in the mask). Ions are implanted, forming implanted regions 117. The semiconductor structure 110 is optionally annealed at a suitable temperature after implantation.

One or more suitable implantation materials may be employed. The selection of implantation materials primarily depends on the type of substrate employed, for example, whether a p-type or n-type is used. Examples of implantation materials include one or more of arsenic, boron, $BF_2^4$, antimony, indium, and phosphorus. Implantation is conducted to achieve a suitable dosage. The implantation materials are implanted at a dosage suitable to form buried bitlines. In this connection, implanted regions form the buried bitlines in the resultant SONOS type nonvolatile memory device.

Although not shown, a $V_T$ adjustment implant step may optionally be conducted before or after the bitline implantation step. For example, the structure 110 may be tilted relative to the angle of implantation and implantation may occur through openings in the mask to form implanted regions adjacent the implanted bitline regions. The $V_T$ adjustment implant step typically employs a type dopant opposite that of the bitline implantation species.

Figure 3:
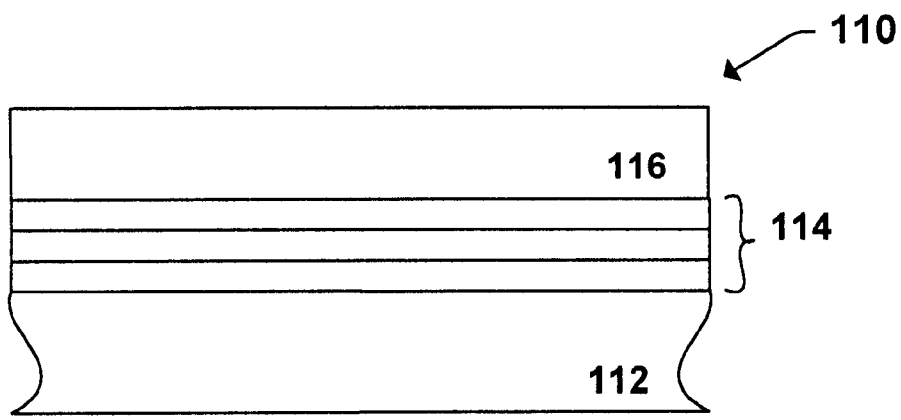
FIG. 3 illustrates a cross-sectional view of a portion of the core region while making a SONOS type memory device in another aspect of the present invention.

Referring to FIG. 3, polysilicon is deposited over the charge trapping dielectric 114 by suitable techniques. In place of polysilicon, doped polysilicon or doped amorphous silicon may be employed. In one embodiment, the polysilicon layer 116 has a thickness (over the charge trapping dielectric 114) from about 500 Å to about 6,000 Å. In another embodiment, the polysilicon layer 116 has a thickness from about 1,000 Å to about 4,000 Å. In yet another embodiment, the polysilicon layer 116 has a thickness from about 1,500 Å to about 3,500 Å.

Figure 4:
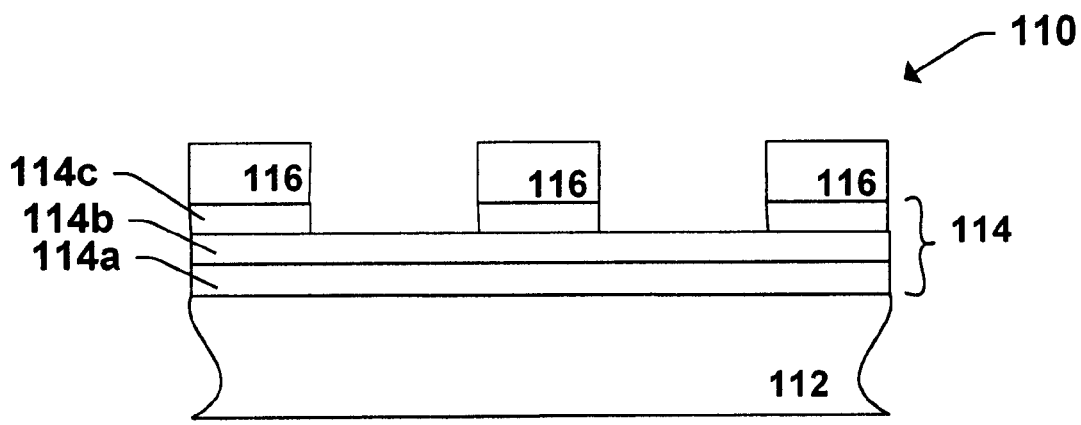
FIG. 4 illustrates a cross-sectional view of a portion of the core region while making a SONOS type memory device in another aspect of the present invention.

Referring to FIG. 4, the polysilicon layers 116 is then patterned using suitable techniques to form polysilicon gates 116. For example, a photoresist (not shown) may be deposited and patterned using standard lithographic techniques covering portions and exposing other portions of the polysilicon layer 116. The exposed portions of the polysilicon layer are removed by standard techniques, such as using anisotropic etching.

In some instances, portions of the top oxide layer 114c of the charge trapping dielectric 114 that are directly below the portions of the polysilicon removed may also be removed by the polysilicon patterning process. In instances where portions of the top oxide layer 114c are not removed or only partially removed, the structure 110 may be subjected to a suitable etch process to completely remove the top oxide layer 114c of the charge trapping dielectric 114 that is directly below the portions of the polysilicon removed. Wet or dry etching may be employed, and wet etching is preferred. For example, the structure can be contacted with a dilute solution of hydrofluoric acid.

Figure 5:
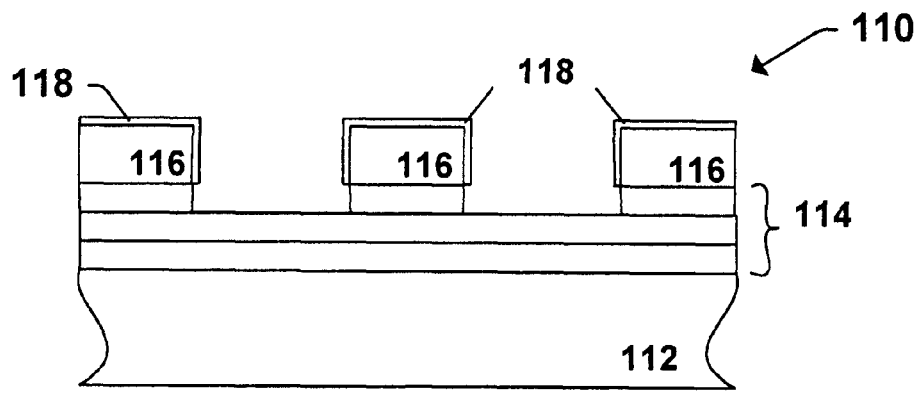
FIG. 5 illustrates a cross-sectional view of a portion of the core region while making a SONOS type memory device in another aspect of the present invention.

Referring to FIG. 5, an insulation material layer 118 is formed adjacent the patterned polysilicon gates 116 using any suitable means, such as chemical vapor deposition (CVD), dry oxidation, wet oxidation or rapid thermal oxidation. Insulation materials include silicon dioxide, silicon nitride, low K materials, silicon oxynitride, fluorine doped silicon glass (FSG) tetraethylorthosilicate (TEOS), phosphosilicate glass (PSG), borophosphosilicate glass (BPSG), borophosphotetraethylorthosilicate (BPTEOS) and the like. In one embodiment, an oxide layer can be grown around the exposed portions patterned polysilicon gates 116 by one of dry oxidation, wet oxidation or rapid thermal oxidation at temperatures from about 750° C. to about 1,100° C.

In some instances during removal of portions of the top oxide layer 114c that are directly below the portions of the polysilicon removed, portions of the top oxide layer 114c that are directly below the remaining patterned polysilicon gates 116 may also be removed. This phenomenon is termed corner undercut. When an oxide insulation material layer 118 is grown around the exposed portions patterned polysilicon gates 116, corner undercut issues are minimized and/or eliminated.

In one embodiment, the insulation material layer 118 is formed to have a thickness from about 50 Å to about 350 Å. In another embodiment, the insulation material layer 118 is formed to have a thickness from about 75 Å to about 325 Å. In yet another embodiment, the insulation material layer 118 is formed to have a thickness from about 100 Å to about 300 Å.

Figure 6:
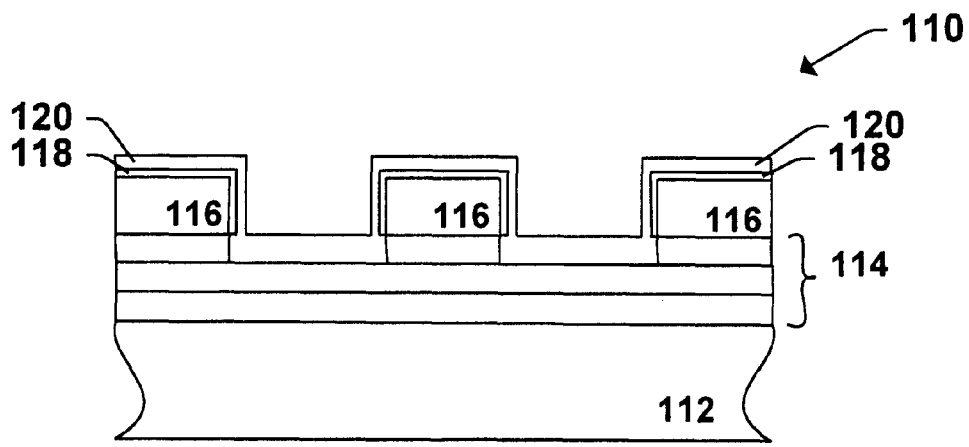
FIG. 6 illustrates a cross-sectional view of a portion of the core region while making a SONOS type memory device in another aspect of the present invention.

Referring to FIG. 6, another insulation material layer 120 is formed over the structure 110 using any suitable means, such as CVD, dry oxidation, wet oxidation or rapid thermal oxidation. As stated above, insulation materials include silicon dioxide, silicon nitride, low K materials, silicon oxynitride, FSG, TEOS, PSG, BPSG, BPTEOS and the like. The second insulation material is the same or different from the first insulation material. CVD methods include low pressure chemical vapor deposition (LPCVD), plasma enhanced chemical vapor deposition (PECVD), and the like. For example, an oxide insulation material layer 120 is deposited by LPCVD techniques using silane and $N_2O$ at a temperature from about 700° C. to about 900° C. Although the formation of two insulation material layers is shown in FIGS. 5 and 6, it is necessary to only form one of the insulation material layers. This is further explained below.

In one embodiment, the insulation material layer 120 has a thickness that is within about 20 Å of the thickness of the top oxide layer 114c, in embodiments where an ONO charge trapping dielectric is employed. In another embodiment, the insulation material layer 120 has a thickness that is within about 10 Å of the thickness of the top oxide layer 114c, in embodiments where an ONO charge trapping dielectric is employed. In yet another embodiment, the insulation material layer 120 has a thickness that is about the same as the thickness of the top oxide layer 114c, in embodiments where an ONO charge trapping dielectric is employed.

In one embodiment, the insulation material layer 120 is formed to have a thickness from about 30 Å to about 250 Å. In another embodiment, the insulation material layer 120 is formed to have a thickness from about 40 Å to about 225 Å. In yet another embodiment, the insulation material layer 120 is formed to have a thickness from about 50 Å to about 200 Å.

Figure 7:
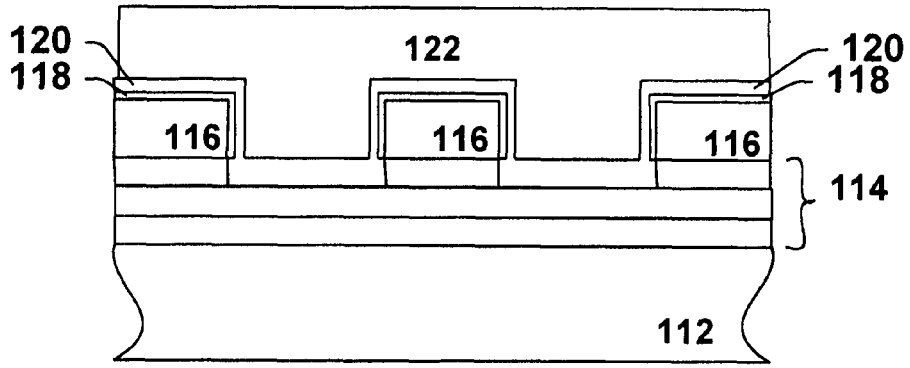
FIG. 7 illustrates a cross-sectional view of a portion of the core region while making a SONOS type memory device in another aspect of the present invention.

Referring to FIG. 7, a second polysilicon layer 122 is deposited over the structure 110. In place of polysilicon, doped polysilicon or doped amorphous silicon may be employed. The polysilicon layer 122 fills the trenches formed by the patterned first polysilicon layer 116 and oxide layers.

Figure 8:
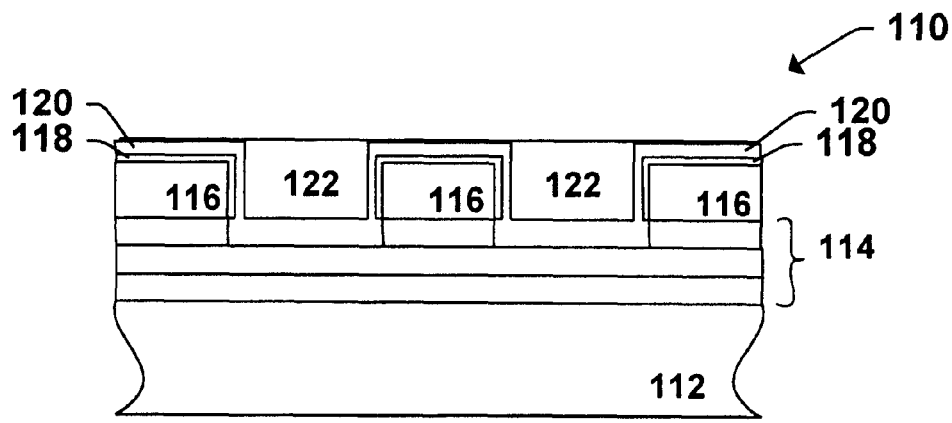
FIG. 8 illustrates a cross-sectional view of a portion of the core region while making a SONOS type memory device in another aspect of the present invention.

Referring to FIG. 8, the structure 110 is planarized using any suitable technique, including blanket wet or dry etching and chemical mechanical polishing (CMP). The structure 110 is planarized or thinned down to the second insulation material 120 or the first insulation material 118. Optionally, a hard mask (not shown) may be formed over the second polysilicon layer 122, the hard mask removed in the core regions, and then the structure 110 is subject to CMP techniques to planarize or remove portions of the second polysilicon layer 122 in the core region and not the periphery region.

Figure 9:
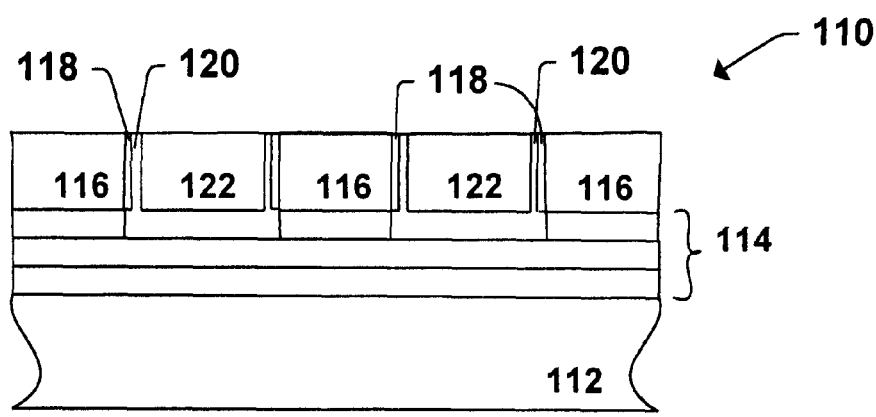
FIG. 9 illustrates a cross-sectional view of a portion of the core region of a SONOS type memory device in accordance with one aspect of the present invention.

Referring to FIG. 9, the remaining portions, if any, of the second insulation material 120 and/or the first insulation material 118 are removed from the structure 110, leaving exposed the first formed polysilicon layer 116 and the second polysilicon layer 122. The resultant structure 110 is planar or substantially planar (in the core region). The first formed polysilicon layer 116 and the second polysilicon layer 122 subsequently form the control gates of the nonvolatile memory cells.

The remaining portions of the second insulation material 120 and/or the first insulation 118 can be removed using a blanket wet etch. The etchant is selected to provide suitable selectivity between oxide and polysilicon (or doped amorphous silicon). That is, the etchant selectively removes/dissolves the insulation material while not substantially removing/degrading polysilicon.

In one embodiment, the second polysilicon layer 122 has a thickness from about 500 Å to about 6,000 Å. In another embodiment, the second polysilicon layer 122 has a thickness from about 1,000 Å to about 4,000 Å. In yet another embodiment, the second polysilicon layer 122 has a thickness from about 1,500 Å to about 3,500 Å.

Each gate of the first formed polysilicon layer 116 is adjacent a gate gate/wordline of the second polysilicon layer 122; that is, the gates of first formed polysilicon layer 116 alternate with the gates of the second polysilicon layer 122. In this connection, "adjacent" means that the gates are next to each other, but they may have layers that separate them (in this instance, one or more oxide layers).

Although not shown, when the polysilicon gates 116 and 122 are formed over the structure 110, further processing is performed to complete the fabrication of SONOS type flash memory devices. For example, core and periphery source/drain regions and gates are doped, spacers are formed, salicidation, completion of formation of SONOS type flash memory cells, select gates, high voltage gates, and low voltage gates, and so on. The gates in the core region and the periphery region may be formed simultaneously or at different times. For example, gates may be initially formed in the core region and later formed in the periphery region or initially formed in the periphery region and later formed in the core region. Moreover, individual gates may be formed simultaneously or at different times within each of the periphery and core regions. The SONOS type memory cells can function and operate as a single bit cell or a double bit cell.

Figure 10:
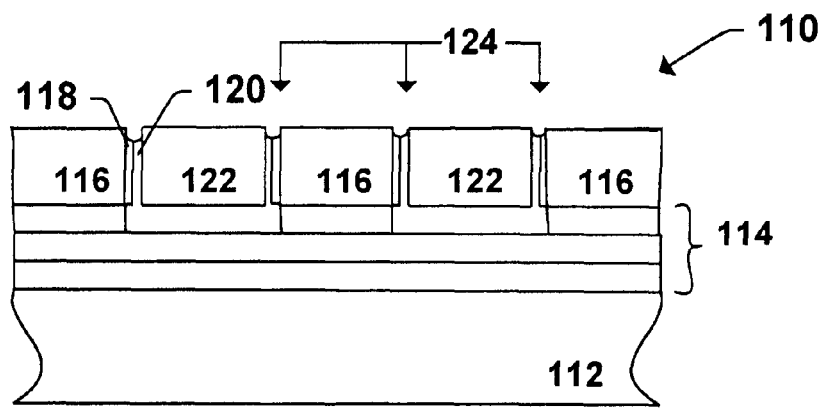
FIG. 10 illustrates a cross-sectional view of a portion of the core region while making a SONOS type memory device in another aspect of the present invention.

Referring to FIG. 10, in some instances when removing the remaining portions of the second insulation material 120 and/or the first insulation material 118 from the structure 110 as discussed in connection with FIG. 9, an undesirably large amount of the second insulation material 120 and/or the first insulation material 118 is removed leaving divots 124 between the first formed polysilicon layer 116 and the second polysilicon layer 122. A planar structure is thus not achieved in these instances.

Figure 11:
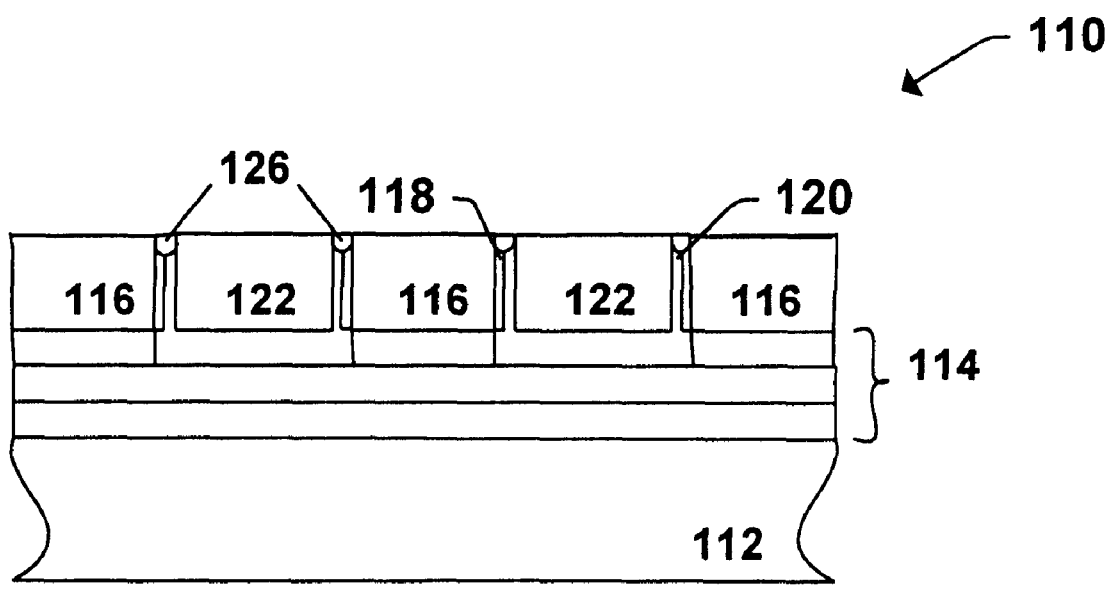
FIG. 11 illustrates a cross-sectional view of a portion of the core region of a SONOS type memory device in accordance with another aspect of the present invention.

Referring to FIG. 11, structure 110 is made at least substantially planar by filling divots 124 with a dielectric material to form spacers 126. Dielectric materials include silicon dioxide, silicon nitride, silicates (such as FSG, TFEOS, PSG, BPSG, BPTEOS), silicon oxynitride, and the like. Silicon nitride is a preferred material. The spacers are formed by depositing the dielectric material, for example by CVD, and then planarizing by CMP or blanket wet etch. Again, although not shown, further processing is performed to complete the fabrication of SONOS type flash memory devices.

Figure 1:
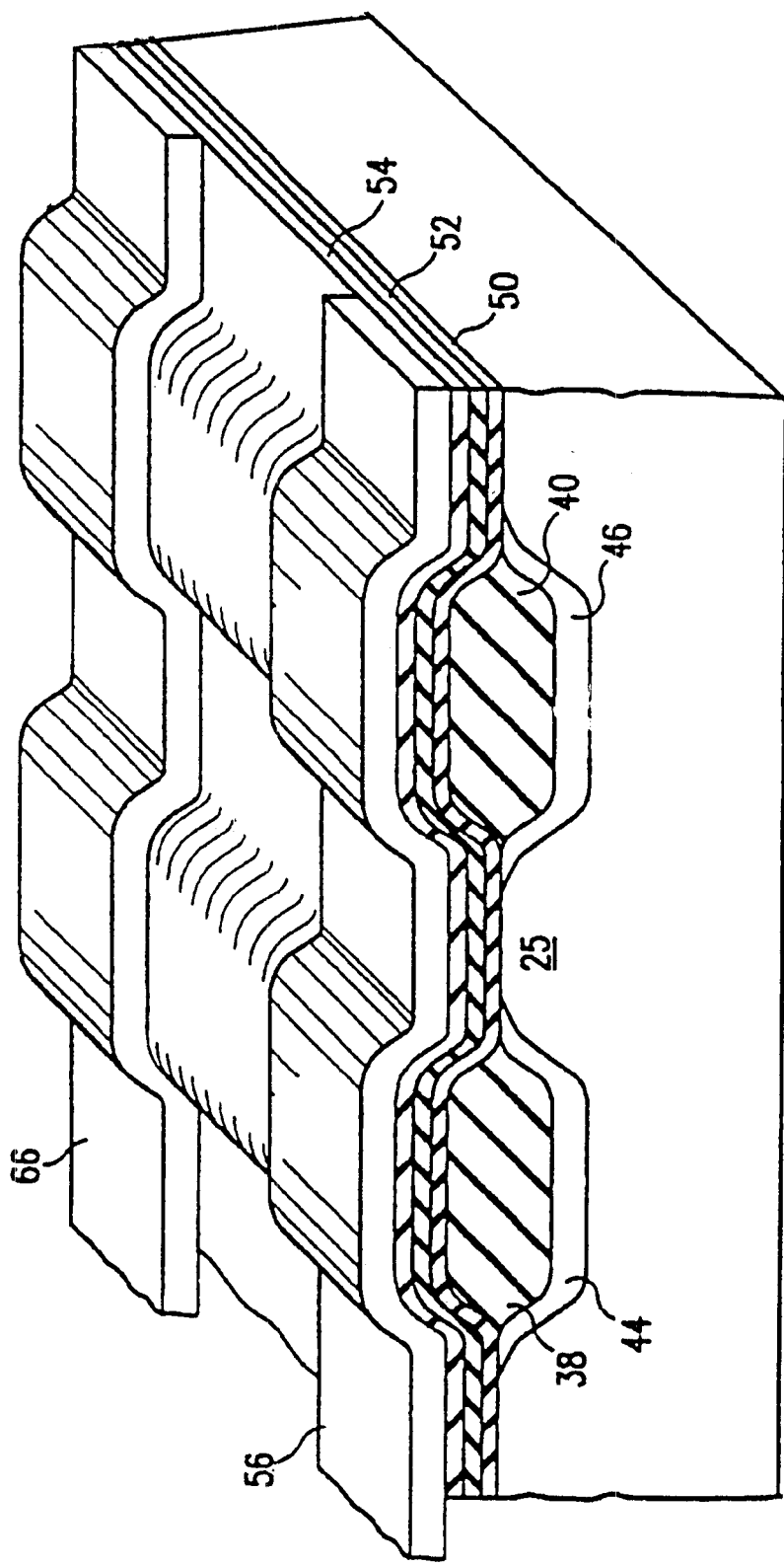
FIG. 1 illustrates a cross-sectional view of a portion of the core region of a prior art SONOS type memory device.

Referring to one or both of FIGS. 9 and 11, the control gates/wordlines of the non-volatile memory cells (patterned polysilicon layer 116 and polysilicon layer 122) are spaced relatively close together, wherein the core region of the memory device may contain up to about twice as many control gates/wordlines compared to a memory device made in a conventional manner (especially those memory devices containing LOCOS in the core region). This is evident comparing the core region shown in prior art FIG. 1 and the core region shown in one or both of FIGS. 9 and 11. Accordingly, in some instances the non-volatile memory devices made in accordance with the present invention have "double densed" core gates.

In one embodiment, the control gates/wordlines of the non-volatile memory cells (patterned polysilicon layer 116 and polysilicon layer 122 in one or both of FIGS. 9 and 11) made in accordance with the present invention have spaces therebetween from about 25 Å to about 600 Å (less than about 600 Å). In another embodiment, the control gates/wordlines of the non-volatile memory cells made in accordance with the present invention have spaces therebetween from about 100 Å to about 550 Å (less than about 550 Å). In yet another embodiment, the control gates/wordlines of the non-volatile memory cells made in accordance with the present invention have spaces therebetween from about 150 Å to about 500 Å (less than about 500 Å).

Typically when a semiconductor device is scaled, the channel lengths become shorter and short channel effects take hold. Thus, in the case of a two bit memory cell, because each bit is stored in different areas of the transistor, short channel effects may become prevalent sooner than in the case of the single bit transistor. However, in the SONOS type memory devices of the present invention, short channeling effects are minimized, since there is no LOCOS in the core region.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of forming a non-volatile semiconductor memory device, comprising:

forming a charge trapping dielectric over a substrate, the substrate having a core region;

forming a first set of memory cell control gates over the charge trapping dielectric in the core region;

forming a conformal insulation material layer around the first set of memory cell control gates; and forming a second set of memory cell control gates in the core region, wherein each memory cell control gate of the second set of memory cell control gates is horizontally adjacent to at least one memory cell control gate of the first set of memory cell control gates, each memory cell control gate of the first set of memory cell control gates is horizontally adjacent at least one memory cell control gate of the second set of memory cell control gates, and the conformal insulation material layer is positioned between each horizontally adjacent memory cell control gate.

2. The method according to claim 1, wherein the conformal insulation material layer has a thickness from about 25 Å to about 600 Å.

3. The method according to claim 1, wherein two conformal silicon dioxide layers surround the first set of memory cell control gates.

4. The method according to claim 1, wherein the first set of memory cell control gates and the second set of memory cell control gates comprise one of polysilicon, doped polysilicon, and doped amorphous silicon.

5. The method according to claim 1, further comprising forming buried bitlines in the core region before forming the first set of memory cell control gates.

6. The method according to claim 1 with the proviso that LOCOS is not formed in the core region.

7. A method of increasing core gate density in a non-volatile semiconductor memory device, comprising:

forming a charge trapping dielectric over a substrate, the substrate having a core region;

forming a first set of memory cell control gates over the charge trapping dielectric in the core region;

growing a silicon dioxide layer around the first set of memory cell control gates;

depositing an insulation material layer conformally over the silicon dioxide layer;

depositing a polysilicon layer over the insulation material layer; and planarizing the substrate to form a second set of memory cell control gates in the core region, wherein each memory cell control gate of the second set of memory cell control gates is horizontally adjacent at least one memory cell control gate of the first set of memory cell control gates, and the silicon dioxide layer and the insulation material layer are positioned between each horizontally adjacent memory cell control gate.

8. The method according to claim 7, further comprising forming buried bitlines in the core region before forming the first set of memory cell control gates.

9. The method according to claim 7, wherein the silicon dioxide layer has a thickness from about 50 Å to about 350 Å and the insulation material layer has a thickness from about 30 Å to about 250 Å.

10. The method according to claim 7, wherein the first set of memory cell control gates has a thickness from about 500 Å to about 6,000 Å and the second set of memory cell control gates has a thickness from about 500 Å to about 6,000 Å.

11. The method according to claim 7, further comprising forming silicon nitride spacers between horizontally adjacent memory cell control gates after planarizing.

12. The method according to claim 7, wherein the charge trapping dielectric comprises one of an ONO trilayer dielectric, an oxide/nitride bilayer dielectric, a nitride/oxide bilayer dielectric, an oxide/tantalum/oxide bilayer dielectric, an oxide/tantalum oxide/oxide trilayer dielectric, an oxide/ strontium titanate bilayer dielectric, an oxide/barium strontium titanate bilayer dielectric, an oxide/strontium titanate/ oxide trilayer dielectric, an oxide/strontium titanate/barium strontium titanate trilayer dielectric, and an oxide/hafnium oxide/oxide trilayer dielectric.

13. The method according to claim 7, wherein the charge trapping dielectric comprises an ONO dielectric comprising at least one of a nitrided oxide layer and a silicon-rich silicon nitride layer.

14. The method according to claim 7, with the proviso that LOCOS is not formed in the core region.

15. A method of forming a SONOS type non-volatile semiconductor memory device, comprising:

forming an ONO charge trapping dielectric over a substrate, the substrate having a core region;

depositing a first polysilicon layer over the ONO charge trapping dielectric;

patterning the first polysilicon layer to form a first set of memory cell control gates over the ONO charge trapping dielectric in the core region;

growing a first silicon dioxide layer around the first set of memory cell control gates;

depositing a second silicon dioxide layer conformally over the first silicon dioxide layer;

depositing a second polysilicon layer over the second silicon dioxide layer; and planarizing the substrate to form a second set of memory cell control gates in the core region, wherein each memory cell control gate of the second set of memory cell control gates is horizontally adjacent at least one memory cell control gate of the first set of memory cell control gates, and the first silicon dioxide layer and the second silicon dioxide layer are positioned between each horizontally adjacent memory cell control gate.

16. The method according to claim 15, wherein the first silicon dioxide layer has a thickness from about 75 Å to about 325 Å and the second silicon dioxide layer has a thickness from about 40 Å to about 225 Å.

17. The method according to claim 15, wherein the memory cell control gates are separated by a distance from about 125 Å to about 550 Å.

18. The method according to claim 15, wherein the ONO charge trapping dielectric comprising at least one of a nitrided oxide layer and a silicon-rich silicon nitride layer.

19. The method according to claim 15, wherein the first set of memory cell control gates has a thickness from about 1,000 Å to about 4,000 Å and the second set of memory cell control gates has a thickness from about 1,000 Å to about 4,000 Å.

20. The method according to claim 15, further comprising performing a blanket threshold implant prior to forming the ONO charge trapping dielectric over the substrate.

21. The method according to claim 1, further comprising forming silicon nitride spacers between horizontally adjacent memory cell control gates after planarizing.

22. The method according to claim 15, further comprising forming silicon nitride spacers between horizontally adjacent memory cell control gates after planarizing.

* * * * *